July 12, 1966 W. KAFKA 3,260,856

SUPERCONDUCTOR CIRCUIT ASSEMBLY

Filed Feb. 15, 1963

United States Patent Office 3,260,856

Patented July 12, 1966

3,260,856

SUPERCONDUCTOR CIRCUIT ASSEMBLY

Wilhelm Kafka, Tennenlohe, near Erlangen, Germany, assignor to Siemens-Schuckertwerke Aktiengesellschaft, Berlin-Siemensstadt, Germany, a corporation of Germany Filed Feb. 15, 1963, Ser. No. 258,799
Claims priority, application Germany, Feb. 16, 1962, S 78,059
7 Claims. (Cl. 307—88.5)

My invention relates to electric circuits for cryogenic superconductors, for example magnets with excitation coils consisting of superconductors, or transformers with windings consisting of superconductors.

Such superconducting circuit components must be connected with circuit portions of the ordinary conductance type. A very high temperature drop occurs at the connecting points due to the necessity of maintaining superconductors at extremely low temperatures. For example, the superconductors may be located within a gas-tight thermally insulating envelope filled with evaporating, liquid helium or other cryogenic agent, and copper conductors of conventional type pass through the gas-tight insulating envelope. The copper conductor may be approximately ambient room temperature. Hence, an extreme temperature difference prevails at the junction points between the superconductor and the ordinary conductors and causes a correspondingly large amount of heat to flow from the copper conductors to the superconductor. This amount of heat must be removed by means of the cooling agent. Due to the large copper cross sections in utility or industrial power plants the amount of heat thus to be removed by the cooling agent is so large as to greatly increase the consumption of cooling agent. This is undesirable because of the resulting increase in size of the low-temperature equipment as well as for reasons of economy.

It is an object of my invention to overcome the above-mentioned shortcomings.

According to a feature of my invention, I insert at the connecting point of the superconductor with the ordinary conductor, thermoelectrically effective semiconductors in such a manner as to block the flow of heat from the ordinary conductor to the superconductor, and preferably to cool the conductor.

According to another feature I insert such thermoelectric semiconductors at both the respective connecting points of the superconductor with the ordinary conductor.

According to still another feature I insert at the connecting point of the superconductor with the ordinary conductor two parallel electric paths, and I include in each path a thermoelectric semiconductor and a semiconductor diode, the respective thermoelectric semiconductors being of opposite conductivity and the respective diodes being oppositely poled.

Other objects and advantages will be pointed out or become obvious from the following description of several embodiments of the present invention, reference being had to the accompanying drawings, in which.

Figure 1:
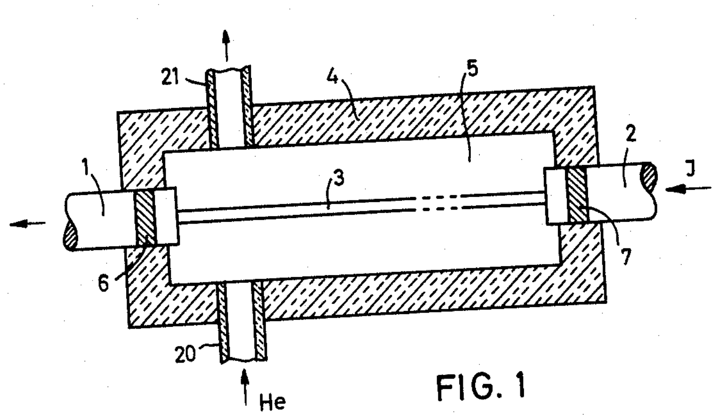
FIG. 1 is a partially sectional view of a direct-current circuit assembly embodying features of the invention.

In FIG. 1, the circuit sections 1 and 2, each comprising a copper conductor, are to be conductively connected by means of another circuit section comprising a superconductor 3.

This superconductor 3, for example, constitutes the excitation coil of a magnet and may be made of niobium-tin ($Nb_3Sn$), niobium-zirconium (NbZr), vanadium-gallium or vanadium-silicon compounds. The superconductor 3 is hermetically sealed within a thermal insulation vessel 4 which contains, for example, boiling helium 5 as a cooling agent. The above-mentioned copper leads 1 and 2 are inserted in a gas-tight manner into the two end faces of the thermal insulation body 4. Two thermoelectric semiconductors members 6 and 7, each of which is inserted and embedded into the thermal insulation body, establish respective connections between the copper leads 1 and 2 and the superconductor 3. Substances which are adapted for use as thermoelectrical semiconductors of this type are, for instance, bismuth-antimony-telluride ($BiSbTe_3$), bismuth telluride ($Bi_2Te_3$), bismuth selenide ($Bi_2Se_3$), bismuth-selenium-telluride, lead selenide, lead telluride, and bismuth antimonide. The compound bismuth antimonide consists of 88% by weight of bismuth and 12% by weight of antimony and, depending on the operational temperature, can be located in a magnetic field of several hundred up to several thousand gauss.

With direct current I flowing through the conductor device in the direction indicated by the arrow, an n-type thermoelectric semiconductor is provided at the current entrance point, whereas a p-type thermoelectric semiconductor is provided at the current exit. For this purpose the thermoelectric semiconductors are selected so that they will reduce or substantially prevent heat conduction from the copper conductor to the superconductor. If desired, the semiconductor members may provide cooling, by the Peltier effect, on the side of the copper conductor facing the superconductor.

The invention also contemplates that the transition from the temperature of the boiling liquid coolant 5 to the ambient temperature of the copper leads be effected in several steps. For such purposes a plurality of serially connected thermoelectrical semiconductors may be inserted between the two circuit portions 1 and 3, 2 and 3. The intermediate steps are each adapted to be individually cooled. Substances which are particularly well suited for such cooling are evaporating hydrogen, evaporating air, evaporating carbon dioxide, evaporating ethylene, evaporating xenon, or evaporating ammonia. This secures particularly good thermal blocking action between the superconductor and the ordinary conductors of copper or other metals.

The above-described circuit assembly is not suited for superconductor operation with alternating current, because it can prevent flow of heat only for one direction of current flow. However, my invention also provides for protection of the superconductor against the admission of heat for both directions of current flow, as required in alternating-current operation. For this purpose, I interpose between the superconductor and the ordinary conductor a semiconductor device, as illustrated in FIG. 2 in which identical elements are denoted by the same reference numerals as in FIG. 1.

Figure 2:
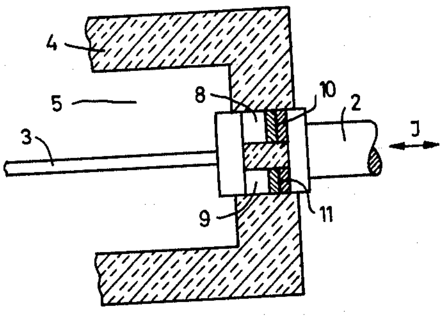
FIG. 2 is a partially sectional view of part of an alternating current assembly embodying features of the invention.

According to FIG. 2, which shows only part of the device and only one terminal thereof, this device comprises one superconductor 3 which constitutes the winding of a transformer, the thermal insulation 4, the cooling agent 5, and one of the copper conductors 2. Two respectively different parallel paths within the thermal insulation body 4 electrically connect the superconductor 3 and the copper conductor 2. The first parallel path consists of an n-type thermoelectric semiconductor body 8, with a semiconductor diode 10 arranged in series therewith. The other parallel path is composed of a p-type thermoelectric seimconductor body 9, with a semiconductor diode 11 in series therewith. Preferably crystal-type semiconductors of high load capacity, such as germanium or silicon, are used as semiconductor diodes. Both semiconductor diodes are of the n-p type, having layers arranged to form with the respective thermoelectric semiconductor bodies, an n-p-n layer structure in the first path, and a p-n-p layer structure in the second path. Thus, current flows readily in one direction in the current path comprising the thermoelectric semiconductor body 8 and the semiconductor diode 10. Current flows readily in the other direction in the path comprising the thermoelectric semiconductor body 9 and the semiconductor diode 11.

Instead of connecting such a thermoelectric semiconductor body in series with a semiconductor diode, it is also contemplated that a thermoelectric semiconductor exerting a rectifying effect be used. Such a rectifying device need be rated merely to block the voltage drop in the diode and in the thermoelectric semiconductor body of the other parallel path. Only very low reverse voltages with small voltage drops are involved.

The feature mentioned with respect to FIG. 1, wherein the transition from the temperature of the boiling liquid to the ambient temperature of the copper leads is effected in several steps by series connected heat blocking means with each of the blocking means being cooled separately is also applicable to FIG. 2.

Figure 3:
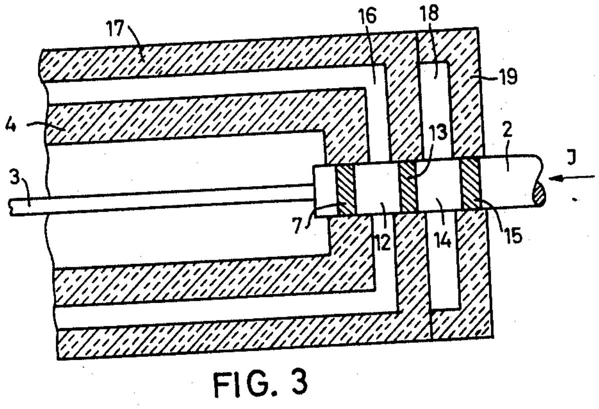
FIG. 3 is a partially sectional view of another embodiment of the device illustrated in FIG. 1.

An embodiment of such a series assembly for direct current is shown in FIG. 3, wherein elements corresponding to the elements of FIG. 1 have been designated with like reference numerals. The transition from the temperature of the liquid cooling agent 5 to the ambient temperature of the copper conductor 2 occurs in three steps through an inner, intermediate and outer cooling wall, designated 4, 17 and 19 respectively. The walls 4, 17 and 19 enclose spaces 5, 16 and 18 respectively.

Where the current passes through the outer wall 19 of the thermally insulating vessel, the copper conductor 2 connects to an n-type thermoelectric semiconductor body 15. Within the intermediate space 18 which contains liquid ethylene or xenon, and which is located between the thermally insulating walls 17 and 19, the current is conducted by a copper or aluminum conductor 14. Current flows through the wall 17 via a thermoelectric semiconductor body 13 exhibiting the Peltier effect, and through a copper or aluminum conductor 12 passing through the space 16 which is filled with liquid nitrogen. The remaining construction within the wall 17 of the vessel corresponds to the structure illustrated in FIG. 1.

The thermoelectric semiconductor bodies 7, 13 and 15 each block heat flow from the conductors 3, 12 and 14 in the respective chambers 5, 16 and 18 to the respective adjacent conductors 12, 14 and 2.

While various embodiments of the invention have been described in detail it will be obvious to those skilled in the art that the invention may be practiced otherwise.

I claim:

1. An electric superconductor circuit assembly, comprising a cryogenic superconductor and ordinary conductance-type conductor means electrically joined with each other, and two circuit branches each interposed between said superconductor and conductor means at the junction location thereof and electrically joined with both in mutually parallel relation, said circuit branches each including thermoelectric semiconductor means of respectively opposite conductance types and semiconductor diodes of respectively opposite polarity for reducing heat supply from said conductor means to said superconductor when traversed by electric current.

2. An electric superconductor circuit assembly, comprising a cryogenic superconductor and ordinary conductance-type conductor means electrically joined with each other, and two circuit branches each interposed between said superconductor and conductor means at the the junction location thereof and electrically joined with both in mutually parallel relation, and diodes of opposite polarity in series with the respective thermoelectric semiconductor means for reducing heat supply from said conductor means to said superconductor when traversed by electric current.

3. An electric superconductor circuit assembly, comprising a superconductor having cryogenic cooling means, two conductors of ordinary conductance type between which said superconductor is connected electrically in series, two joining means each interposed between and conductively joined with said superconductor and said two other conductors respectively, said joining means each comprising a pair of circuit branches each joining said superconductor and said conductors, said circuit branches of each pair each including one of two thermoelectric semiconductor means of respectively opposite conductance types and one of two semiconductor diodes of respectively opposite polarity in series with the respective thermoelectric semiconductor means for reducing heat supply from said conductor means to said superconductor when traversed by electric current.

4. An electric superconductor circuit assembly, comprising a cryogenic superconductor and ordinary conductance-type conductor means electrically joined with each other, and a pair of circuit branches each interposed between said superconductor and conductor means at the junction location thereof and electrically joined with both in mutually parallel relation, said branches each including thermoelectric semiconductor means and diodes in series with the respective thermoelectric semiconductor means for reducing heat supply from said conductor means to said superconductor when traversed by electric current, said semiconductor means and said diodes of the two circuit branches having respective conductance types and polarities arranged respectively in p-n-p and n-p-n relation.

5. An electric superconductor circuit assembly, comprising a cryogenic superconductor and ordinary conductance-type conductor means electrically joined with each other, and two circuit paths each interposed between said superconductor and conductor means at the junction location thereof and electrically joined with both in mutually parallel relation, said circuit paths each including a thermoelectric semiconductor means of respectively opposite conductance types for reducing heat supply from said conductor means to said superconductor when traversed by electric current, said semiconductor means having rectifying properties for exerting a rectifying effect.

6. An electric superconductor circuit assembly comprising a cryogenic superconductor, a plurality of ordinary conductance type conductor means electrically joined in series with each other and with said superconductor, a plurality of thermoelectric semiconductor members each interposed at the respective junction locations, and electrically joined with the adjacent conductor means and superconductor for thermoelectrically reducing the heat supply between said conductor means and said superconductor when traversed by electric current and separate cooling means for said plurality of conductor means and said superconductor.

7. An electric superconductor circuit assembly comprising a cryogenic superconductor, a plurality of ordinary conductance type conductor means electrically joined in series with each other and with said superconductor, and a plurality of joining means each interposed at respective junction locations and electrically joined with said superconductor and said respective conductor means, said joining means each comprising two circuit branches each joining said superconductor and said conductor means, said circuit branches each including one of two thermoelectric semiconductor means of respectively opposite conductance types and one of two semiconductor diodes of respectively opposite polarity in series with the respective thermoelectric semiconductor means and separate cooling means for said conductor means and said superconductor.

References Cited by the Examiner

UNITED STATES PATENTS

| | | | |
|---|---|---|---|
| 2,963,531 | 12/1960 | Seegert | 62—3 X |
| 2,978,570 | 4/1961 | Hanlein | 62—3 |

ARTHUR GAUSS, *Primary Examiner.*

JOHN W. HUCKERT, *Examiner.*

M. LEE, R. H. EPSTEIN, *Assistant Examiners.*